United States Patent [19]
Mallon et al.

[11] Patent Number: 5,719,084
[45] Date of Patent: *Feb. 17, 1998

[54] METHOD FOR THE CONTROLLED FORMATION OF VOIDS IN DOPED GLASS DIELECTRIC FILMS

[75] Inventors: Thomas G. Mallon, Santa Clara; Chi-yi Kao, San Jose; Wei-jen Hsia, Sunnyvale, all of Calif.; Atsushi Shimoda, Tsukuba, Japan

[73] Assignee: LSI Logic Corporation, Milpitas, Calif.

[ * ] Notice: The term of this patent shall not extend beyond the expiration date of Pat. No. 5,278,103.

[21] Appl. No.: 564,922

[22] Filed: Nov. 29, 1995

Related U.S. Application Data

[63] Continuation of Ser. No. 179,166, Jan. 10, 1994, abandoned, which is a continuation of Ser. No. 23,304, Feb. 26, 1993, Pat. No. 5,278,103.

[51] Int. Cl.$^6$ .................................................. H01L 21/469
[52] U.S. Cl. .................................................. 438/783; 438/632
[58] Field of Search .................................. 437/238, 240, 437/927, 978, 982; 148/DIG. 43, DIG. 73, DIG. 133

[56] References Cited

U.S. PATENT DOCUMENTS

| | | | |
|---|---|---|---|
| 4,571,819 | 2/1986 | Rogers et al. | 148/DIG. 133 |
| 5,004,704 | 4/1991 | Maeda et al. | 437/982 |
| 5,166,101 | 11/1992 | Lee et al. | 437/240 |
| 5,278,103 | 1/1994 | Mallon et al. | 437/240 |

OTHER PUBLICATIONS

Stanley Wolf, PH.D, "Silicon Processing For The VLSI Era", 1986, pp. 189–196.

*Primary Examiner*—Chandra Chaudhari
*Attorney, Agent, or Firm*—Oppenheimer Poms Smith

[57] ABSTRACT

A method is provided for the controlled formation of voids in integrated circuit doped glass dielectric films. The film can be formed of borophosphosilica glass (BPSG) or other types of doped glass. The method involves the steps of providing a substrate on which conductors are formed, depositing a first layer of doped glass to a thickness in a predetermined ratio to the size of the space between conductors, reflowing the first doped glass layer, applying one or more additional doped glass layers to make up for any shortfall in desired total doped glass thickness, and performing a high temperature densification to smooth each additional layer. The method provides for increased integrated circuit speed by controlled formation of voids which have a low dielectric constant and therefore reduce capacitance between adjacent conductors. The method can be performed using existing doped glass deposition and reflow equipment.

42 Claims, 2 Drawing Sheets

METHOD FOR THE CONTROLLED FORMATION OF VOIDS IN DOPED GLASS DIELECTRIC FILMS

This application is a continuation of U.S. patent application Ser. No. 08/179,166, filed Jan. 10, 1994, now abandoned; which is a continuation of U.S. patent application Ser. No. 08/023,304, filed Feb. 26, 1993, now U.S. Pat. No. 5,278,103.

BACKGROUND OF THE INVENTION

1. Field of the Invention

The present invention relates to semiconductor integrated circuits and methods for manufacturing the internal dielectric structure thereof. More particularly, the present invention relates to a method for controlled intentional formation of voids in an integrated circuit doped glass dielectric film in order to reduce capacitance between adjacent conductors and thereby enhance the circuit speed capability.

2. Description of Related Art

Semiconductor integrated circuits typically contain several different types of conductors, formed from materials such as aluminum alloy and polysilicon. A dielectric layer is used to separate and insulate the various conductors. Doped glass is commonly used as an integrated circuit dielectric because its melting point can be made significantly lower than that of regular glass or other dielectric materials. Borophosphosilica glass (BPSG) is one exemplary type of doped glass. After deposition over a pattern of polysilicon conductors, for example, a relatively rough BPSG dielectric layer can be put through a high temperature fellow process, usually at about 900° C., which in effect melts the BPSG and thereby smooths its surface. Ordinary glass, however, does not melt until roughly 1400° C., so reflow is more difficult and risks damaging other parts of the integrated circuit structure. The smoother BPSG dielectric layer simplifies subsequent processing steps and improves the reliability of the resultant device. Similar advantages result from the use of other types of doped glass.

As integrated circuit dimensions shrink in response to market demands for increased speed and reduced circuit size, the spaces between adjacent conductors also become smaller. However, adjacent conductors and the intervening dielectric material form a parasitic capacitance which limits the signal speed which the conductors can support. The amount of capacitance depends upon the distance between the adjacent conductors as well as the type of dielectric material separating them. This capacitance represents a significant limitation on integrated circuit speed enhancement and size reduction.

In order to minimize the effect of parasitic capacitance, one can either increase the separation between adjacent conductors or reduce the dielectric constant of the material between them. Since size constraints typically prevent sufficient separation of the conductors, the more desirable and practical approach is to reduce the dielectric constant of the separating material. The best dielectric material is a vacuum, which has a dielectric constant of 1.0. Air is also a very good dielectric, with a constant just slightly higher than that of a vacuum. A typical BPSG material, however, has a significantly higher dielectric constant of about 3.6 to 3.9. One technique which has been used to reduce the dielectric constant of the BPSG film between adjacent conductors is to allow voids to form in the film at appropriate locations. The voids can form during the chemical vapor deposition process, for example, in spaces between conductors. These voids are essentially air or vacuum filled and therefore constitute a low dielectric constant region between conductors. In this manner, the capacitance between adjacent conductors is reduced, and the speed performance of the integrated circuit can be improved without increasing device size.

Despite the speed improvements which voids in BPSG films can provide, their proper formation is presently very difficult to control. For example, voids between adjacent conductors are formed when a BPSG layer is deposited on top of a polysilicon conductive pattern. However, during the fellow process, the voids may disappear if the spaces between polysilicon conductors are large enough or the deposited film is thin enough. The voids formed when a BPSG layer about 7000 Angstroms is deposited over a circuit topography of conductors separated by about 1.0 micron are typically eliminated during reflow. It is not possible to forego the fellow process without losing the smoothness and related benefits which that process provides. Therefore, under current practice desirable properly placed BPSG voids are removed by the equally desirable reflow process.

Furthermore, the problem is not solved by simply increasing the thickness of the deposited BPSG film because the resultant voids may be improperly placed and create device yield and reliability problems. For example, voids may form close to the upper surface of the deposited BPSG film. In subsequent processing, it is common for the BPSG film to undergo etching after which a layer of aluminum is deposited from which additional conductors will be formed. If the BPSG is etched down to the level of a void, the void becomes an imperfection in the etched BPSG surface. The imperfection will run parallel to the underlying conductors between which it was formed. When the deposited aluminum layer is etched to form conductors, a portion of the aluminum filling the imperfection may remain and short out the etched conductors. Other problems can result from voids inducing imperfections elsewhere in the circuit structure. As a result, it would usually be better to completely eliminate void formation than to risk imperfections in the BPSG film. In order to obtain the speed advantages of the voids it is therefore essential that void formation be accurately controlled to ensure proper placement in the BPSG layer.

As is apparent from the above, there presently is a need for a method for controlled formation of voids in integrated circuit doped glass dielectric films. The method should permit formation of voids at desired points in the integrated circuit doped glass dielectric in order to obtain significant reductions in capacitance and resultant improvements in circuit speed. The method should also preserve the smoothness and associated benefits provided by the current doped glass reflow process, without risking potential imperfections in subsequent doped glass etching. Furthermore, the method should be compatible with existing deposition and fellow equipment.

SUMMARY OF THE INVENTION

In accordance with the present invention, a method of controlled intentional formation of voids in integrated circuit doped glass dielectric films is provided. Although the method is particularly well suited for the formation of voids between polysilicon conductors, the method can also be applied to the formation of voids between other types of conductors or other elements of an integrated circuit topography. Furthermore, although the invention is described in this specification using one exemplary type of doped glass, this is by way of example and not limitation. The present invention can be applied to a variety of other integrated circuit doped glass dielectric films in which voids can form.

The present invention is based upon the discovery that voids may be formed in doped glass in a controlled manner by depositing a thickness of doped glass which is proportional to the desired void size. The method provides a semiconductor substrate on which a number of conductors have been formed. The conductors are separated by spaces. A first layer of doped glass is deposited over the substrate and the conductors to a thickness which is proportional to the space size. The first layer of doped glass is then reflowed to smooth the deposited layer. By making the thickness of the first doped glass layer proportional to the size of the space in which the desired void is formed, the voids will not be removed during the reflow process. The method can thus produce voids which are properly placed in the spaces between adjacent conductors. The properly placed voids will represent a lower dielectric constant and therefore a lower capacitance between conductors, resulting in improved circuit speed capability.

In accordance with another aspect of the present invention, any desired thickness of doped glass may be produced by depositing additional doped glass layers over the first reflowed layer, and performing a high temperature oxide densification process on each additional layer. In this manner, void formation will no longer be influenced by the total desired doped glass thickness. The voids can be properly formed using the first layer. After formation has been made permanent as a result of the reflow, the additional thickness can be deposited in one or more additional layers.

As a feature of the present invention, controlled void formation is made possible by using an initial doped glass layer of suitable thickness to permit the voids to be maintained and properly positioned despite the reflow process. The thickness of the first layer of doped glass is chosen to facilitate void formation, maintenance and placement throughout reflow. Voids are only formed in desired locations, and the danger of imperfections from subsequent doped glass etching steps is eliminated.

As another feature of the present invention, the controlled formation of voids is accomplished without sacrificing the benefits of doped glass fellow. By reflowing the first doped glass layer, the primary benefits of smoothing, including simplifying subsequent steps and improving the device reliability, are obtained. These benefits are maintained despite the additional doped glass layers by performing a high temperature oxide densification process following deposition of each additional layer.

As a further feature of the present invention, the method can be used with existing deposition and fellow equipment. The method expands the capability and versatility of processes and equipment typically used under current practice. One can therefore obtain the advantages of the present invention without the substantial expense of new equipment.

The above-discussed features and attendant advantages of the present invention will become better understood by reference to the following detailed description of the preferred embodiments and the accompanying drawings.

DETAILED DESCRIPTION OF THE PREFERRED EMBODIMENT

Figure 1:
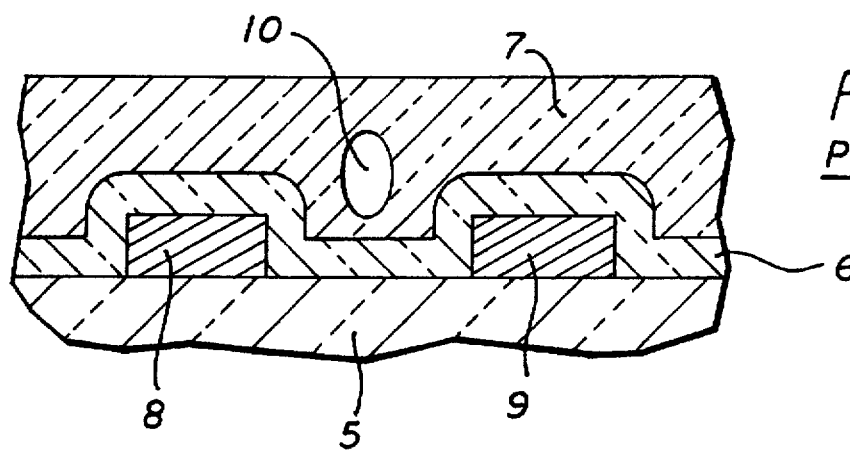
FIG. 1 (prior art) is a cross-section of a portion of an integrated circuit showing an exemplary formation of a void between adjacent conductors.

The present invention provides a method for the controlled formation of voids in doped glass dielectric films such that the void is not removed by subsequent reflow processes. Furthermore, any desired doped glass thickness can be formed by depositing an additional layer of doped glass after reflowing the first layer. As mentioned above, the method is applicable to doped glass dielectric films formed over many different types of conductors. It will be understood by those skilled in the art that the following detailed description, although primarily directed to BPSG dielectrics between polysilicon conductors, discloses processes that can be readily applied to the formation of voids between other elements of the integrated circuit topography. Furthermore, the present invention is also applicable to a wide variety of other doped glass materials, and the emphasis on BPSG in the following description is exemplary only. The term doped glass as used in this specification refers to glass which contains additional elements which have the effect of lowering the melting point of the glass. BPSG is one exemplary type of doped glass.

The prior art as discussed above is illustrated in FIGS. 1 and 2. A portion of an exemplary integrated circuit is shown. The exemplary integrated circuit consists of a semiconductor substrate 5 formed of silicon or other suitable material. Two adjacent polysilicon conductors 8, 9 have been formed on the substrate 5. The conductors 8, 9 are about 3500 Angstroms high and separated by a distance of about 0.8 micrometers. The conductor height is typical, and most integrated circuits will have a constant conductor height of about 3000 to 4000 Angstrom. The distance between conductors, however, may vary considerably even within a single device. The substrate 5 and polysilicon conductors 8, 9 can be covered by an insulating low temperature oxide layer 6 deposited by chemical vapor deposition to a thickness of about 2000 Angstroms.

An initial BPSG layer 7 is then deposited over the oxide layer 6 as an insulator and dielectric, to a thickness of about 7000 Angstroms. The BPSG layer 7 may be deposited by plasma enhanced chemical vapor deposition or other suitable process. A capacitance is developed between adjacent conductors 8, 9 and the capacitance is a function of the separation between the conductors 8, 9 and the dielectric constant of the material between them. This capacitance limits the speed of signal which the conductors can carry and therefore must be minimized if higher circuit speeds are to be attained.

As was mentioned previously, since circuit size constraints do not permit wide separation of conductors within an integrated circuit, the more practical means for reducing the capacitance between the lines is to reduce the dielectric constant of the material between the conductors 8, 9. This can be accomplished by forming a void 10 in the BPSG dielectric 7. Since the void 10 is usually either air or vacuum filled, and thus has a significantly lower dielectric constant than the BPSG itself, the capacitance between conductors 8, 9 is reduced, and the conductors can then carry higher speed signals.

Figure 2:
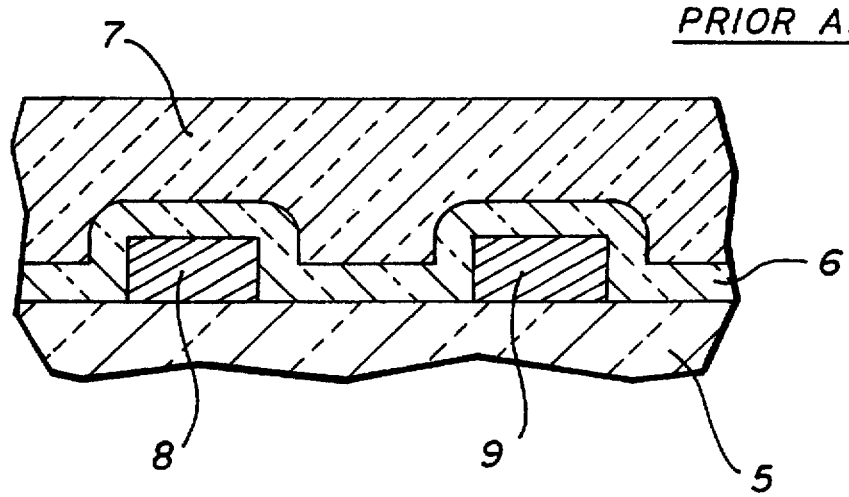
FIG. 2 (prior art) shows the cross-section of FIG. 1 after the void has been eliminated by the doped glass reflow process.

The problems with the prior art are seen in FIG. 2, which represents the same exemplary integrated circuit cross-section shown in FIG. 1 after the BPSG reflow process is performed. The exact results of any particular reflow process will depend upon the exact reflow temperature, the BPSG deposition process used and other system parameters. However, a typical high temperature fellow process, carried out at about 900° C., will soften the BPSG and cause it to flow, thereby eliminating the desired void 10. Although there are certain conditions under which the voids may be maintained despite reflow, under many desired BPSG thicknesses and conductor heights and separations the voids will be removed by the fellow process as shown in FIG. 2. For example, the void formed by a 7000 Angstrom thick layer of BPSG deposited on conductors about 3500 Angstroms high separated by about 0.8 microns, as shown in FIG. 1, will almost always be eliminated during the high temperature reflow.

The present invention overcomes the problems of the prior art by using a multiple layer approach in which a first layer of BPSG is deposited to a thickness such that the desired voids will not be removed by the subsequent fellow. The thickness of this initial layer is a function of the spaces between adjacent conductors in the integrated circuit topography, and this relationship will be discussed further below. If the first layer thickness is chosen proportional to the size of the space in which the void forms, the voids will not be eliminated during reflow as in the prior art. In the exemplary structure of FIG. 3, plasma enhanced chemical vapor deposition is used to form the BPSG layer. Other suitable processes may also be used. Any additional BPSG thickness required is added by depositing and processing additional layers after reflow. In this manner, the benefits of the voids and the reflow are obtained regardless of the ultimate BPSG thickness desired.

Figure 3:
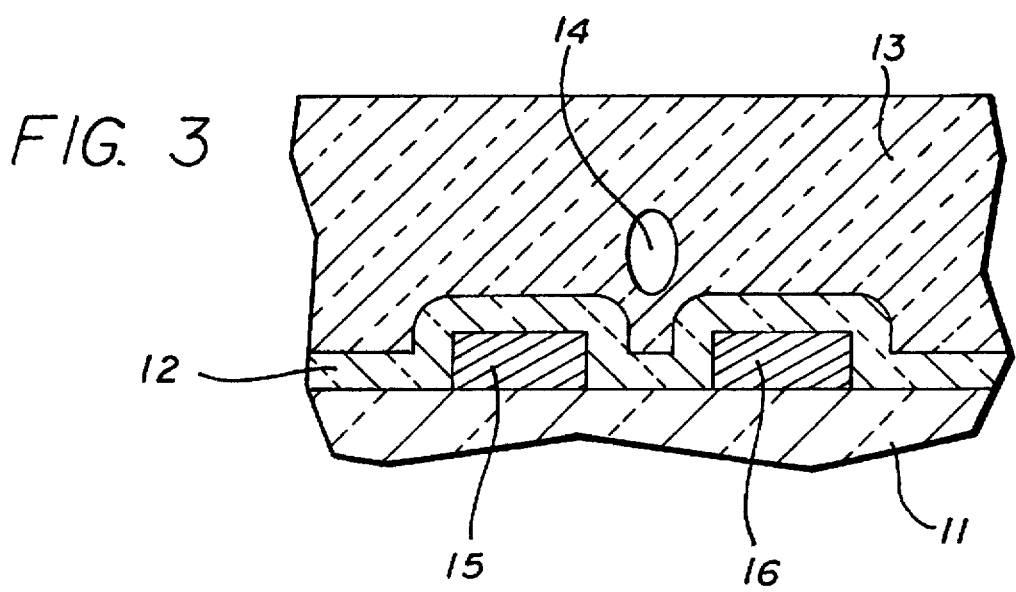
FIG. 3 is a cross-section of a portion of an integrated circuit showing an exemplary formation of a void in accordance with the method of the present invention.

Referring now to FIG. 3, a portion of an exemplary integrated circuit is again shown. The integrated circuit consists of polysilicon conductors 15, 16 formed on a semiconductor substrate 11, and covered by a low temperature deposited oxide layer 12, as in the prior art example. The low temperature oxide is chemical vapor deposited to a thickness of about 1000 to 3000 Angstrom, with a typical value being about 2000 Angstrom. It should be emphasized that this particular structure, and the presence of the various elements included therein, is exemplary only. The integrated circuit need not contain all of these elements. Pot example, a low temperature oxide layer is not required in order to apply the method of the present invention.

In FIG. 3, a suitable thickness of BPSG is chemical vapor deposited over the low temperature oxide 12 covering conductors 15, 16 and substrate 11. The thickness of this first layer is important to the method of the present invention. The thickness should be proportional to the size of the space in which the void is formed, which is in turn a function of the conductor height and separation. In many integrated circuits, the conductor height will be relatively constant throughout, and therefore the conductor separation is the key determinant of space size. For example, if voids are desired only in relatively narrow conductor spacings of about 0.5 microns, the first BPSG layer should be thinner than if voids are desired in larger separations of about 1.0 micron wide. The larger the separation in which a permanent void is desired, the greater the required thickness of the first BPSG layer. The thickness of the first BPSG layer is thus in a predetermined ratio with the size of the space within which the void will form.

In general, a first BPSG layer of about 10,000 to 15,000 Angstrom is appropriate for voids formed in spaces about 0.5 to 1.0 microns wide between conductors about 3000 to 4000 Angstroms high. The width of the space is the distance separating adjacent conductors. Within the above ranges, the thickness should be increased as the width of the spacing increases for a given conductor height. In the exemplary structure of FIG. 3, a first layer of BPSG 14,000 Angstroms thick was deposited in order to permit proper formation of a permanent void between conductors 15, 16 which are 3500 Angstroms high, covered by 2000 Angstroms of low temperature oxide and separated by a distance of about 0.8 microns.

The BSPG layer is preferably deposited to a thickness in microns which is substantially equal to a proportionality factor of 5 microns/microns$^2$ times the cross-sectional area of a selected one of the spaces in microns$^2$.

In the above example, the spaces are 3,500 Angstroms (0.35 microns) high and separated by 0.8 microns, such that the cross-sectional area of the spaces is 0.35 microns×0.8 microns=0.28 microns$^2$. The cross-sectional area multiplied by the proportionality factor of 5 microns/micron$^2$ gives the thickness of the BSPG layer as 0.28 microns×5 microns/micron$^2$ =1.4 microns=14,000 Angstroms.

In certain integrated circuits, there may be many different conductors of varying height and separation. In such a case, the thickness of the first BPSG layer can be determined using an average conductor height and separation if there is not a great disparity between space areas. Alternatively, or where there are substantial differences in spacing areas, the first layer thickness may be chosen such that voids will be formed in the spaces between conductors carrying the highest speed signals, and not formed in the spaces between conductors carrying lower speed signals. In fact, the integrated circuit topography could be designed such that conductor dimensions permit void formation at the points in the circuit where the voids will provide the greatest overall speed improvement for the device.

Figure 4:
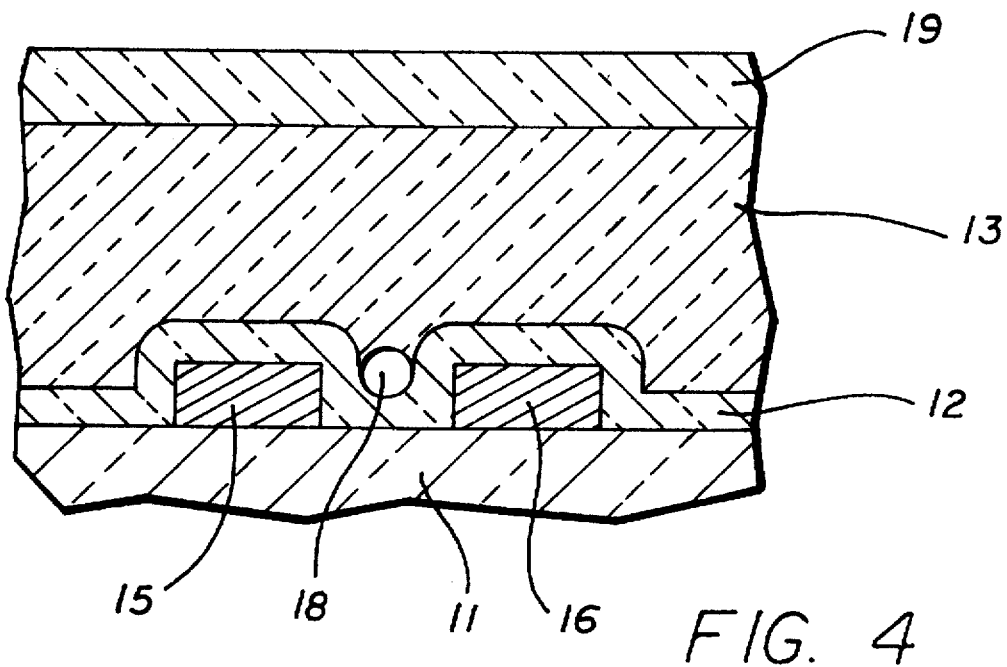
FIG. 4 shows the cross-section of FIG. 3 with the void maintained after the reflow process in accordance with the present invention.

The structure of FIG. 3 is shown after reflow in FIG. 4. The elliptical void 14 shown in FIG. 3 is trapped within the BPSG and becomes the permanent circular void 18 in FIG. 4. The shape of the void is typically altered by the reflow process, and its total area may also be reduced as shown. The fellow process has also served to position the circular void 18 in the appropriate space 17 between conductors 15, 16 rather than to completely eliminate the void as in the prior art example of FIG. 2. The void 18 is lowered within the BPSG so as to be closer to the substrate and conductors. The void so positioned will thereby have the maximum possible capacitance reducing effect and permit higher speed signals to propagate on the conductors 15, 16. In addition, the void is positioned far enough below the BPSG upper surface so that it will not create an imperfection in a subsequent BPSG etching step. It should be noted that the void shapes shown in FIGS. 1 to 4 are exemplary only, and that different void shapes are possible depending upon conductor shape and separation, as well as other structural details of the integrated circuit topography.

Although the example discussed above did not require deposition of any additional layers of BPSG, since the desired total thickness of 14,000 Angstroms was met by the first layer alone, in other cases any deficiency in total BPSG thickness could be compensated for by additional layers. Each additional layer will typically be about 1000 to 15,000 Angstroms thick. Each additional layer would be deposited in the same manner as the first layer, but after the first layer has been reflowed to permanently position the voids. An exemplary second layer 19 is shown in FIG. 4. The second layer will be free of voids and relatively smooth upon deposition, since there are no longer any conductor separations or other spaces in which voids can form, and a second reflow will therefore not be required. A high temperature densification step, carried out at about 600° to 800° C. will serve to further smooth the second layer and thereby ensure high device quality and simplification of subsequent steps. Alternatively, the remaining BPSG thickness could be deposited in several layers, each followed by a high temperature densification step. Although high temperature densification is the preferred method of processing additional layers, partial reflows could be performed instead if the thermal budget of the integrated circuit permits.

The method of the present invention may also be applied to the formation of voids to reduce capacitance between other types of conductors. For example, a typical subsequent processing step performed on the structure of FIG. 4 is the deposition of aluminum conductors over the BPSG film. A capacitance exists between the aluminum conductors and the underlying substrate and polysilicon conductors just as a capacitance exists between adjacent polysilicon conductors. The method of the present invention may be used to form additional voids in the BPSG film at appropriate positions in order to reduce the capacitance between the aluminum conductors and the underlying substrate and polysilicon conductors. Thus, the same effect can be obtained from top to bottom for overlying conductors as was obtained for adjacent conductors in FIG. 4.

Figure 5:
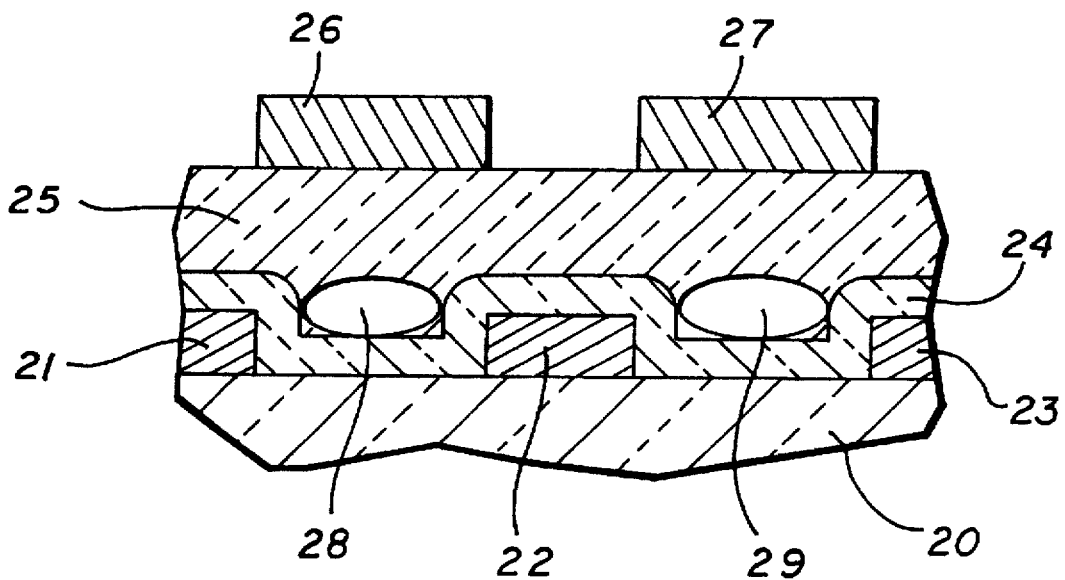
FIG. 5 is a cross-section of a portion of an exemplary integrated circuit in which voids have been formed in accordance with the present invention in order to reduce the capacitance between an upper layer of conductors and the underlying substrate.

An exemplary structure including an upper layer of aluminum conductors is shown in FIG. 5. In this structure, polysilicon conductors 21, 22 and 23 are formed on a semiconductor substrate 20 and covered by a low temperature oxide layer 24. A layer of BPSG of appropriate thickness is deposited such that voids 28, 29 are formed in the BPSG layer and are made permanent by a subsequent fellow process. An additional upper layer of conductors is then formed over the BPSG layer. Two exemplary aluminum conductors 26, 27 are shown. It can be seen that the voids 28, 29 are so placed so as to act as a dielectric material between upper conductors 26, 27 and the underlying substrate 20. Thus, the average dielectric constant of the material separating conductors 26, 27 and substrate 20 is reduced, and the parasitic capacitance on the conductors is thereby reduced. As a result of the lower capacitance, conductors 26, 27 can support higher speed signals than would otherwise be possible absent the voids 28, 29. The method of the present invention can also be used to form voids elsewhere in the dielectric structure using spaces other than those between polysilicon conductors. For example, the topography underlying the BPSG may be designed to include spaces that are present for no purpose aside from forming voids to reduce the capacitance between overlying conductive layers and the substrate.

It will be understood by those skilled in the art that many alternate implementations of this method are possible without deviating from the scope of the invention, which is limited only by the appended claims.

What is claimed is:

1. A method for the controlled formation of voids in a dielectric layer, comprising the steps of:

(a) providing a substrate having a plurality of spaces on a surface thereof;

(b) depositing a doped glass dielectric material over the substrate and said spaces such that voids are formed in said doped glass dielectric material in said spaces; and (c) terminating step (b) to form the dielectric layer when said doped glass dielectric material has been deposited to a thickness which is predetermined in accordance with a size of said spaces such that said voids will remain in the dielectric layer after subsequent reflow thereof.

2. The method of claim 1, further comprising the step of:

(d) reflowing the dielectric layer.

3. The method of claim 2, in which step (d) comprises reflowing the dielectric layer at a temperature of 850° C. to 950° C.

4. The method of claim 1, further comprising the steps of:

(e) depositing an additional doped glass dielectric layer over the dielectric layer formed in steps (a) to (c);

(f) processing the additional doped glass dielectric layer in order to smooth the surface thereof; and and repeating steps (e) and (f) until a desired total thickness of doped glass dielectric material is obtained.

5. The method of claim 4, in which step (e) comprises depositing the additional doped glass dielectric layer to a thickness of 1,000 to 15,000 Angstroms.

6. The method of claim 4, wherein the step of processing the additional doped glass dielectric layer is a reflow process to smooth the surface of the doped glass dielectric layer.

7. The method of claim 4, wherein the step of processing the additional doped glass dielectric layer is a densification process.

8. The method of claim 7, wherein the densification process is performed at a temperature of between about 600° C. and about 800° C.

9. The method of claim 1, in which step (b) comprises depositing said doped glass dielectric material as including borophosphosilicate (BSPG) glass.

10. The method of claim 1, in which step (c) comprises terminating step (b) when said thickness of the dielectric layer is 10,000 to 15,000 Angstroms.

11. The method of claim 1, in which step (a) further comprises providing the substrate such that said spaces have widths of 0.5 to 1.0 micron.

12. The method of claim 1, in which step (a) further comprises providing the substrate such that said spaces have widths of approximately 0.5 micron.

13. The method of claim 1, in which:

step (a) comprises providing the substrate as further including a plurality of conductors formed thereon such that said spaces are defined between the conductors.

14. The method of claim 13, in which step (a) comprises providing the substrate such that the conductors include etched polysilicon conductors.

15. The method of claim 13, in which step (a) further comprises providing the substrate such that said spaces have widths of 0.5 to 1.0 micron.

16. The method of claim 13, in which step (a) further comprises providing the substrate such that said spaces have widths of approximately 0.5 micron.

17. The method of claim 1, in which step (a) further comprises providing the substrate such that the conductors have a height of 3,000 to 4,000 Angstroms.

18. The method of claim 1, further comprising the step, performed between steps (a) and (b), of:

(d) depositing a low temperature oxide layer over the substrate and said spaces.

19. The method of claim 18, in which step (d) comprises depositing the oxide layer to a thickness of 1,000 to 3,000 Angstroms.

20. The method of claim 1, in which step (b) comprises depositing said doped glass dielectric material using plasma enhanced chemical vapor deposition.

21. The method of claim 1, further comprising the step of:
   (d) depositing a conductor over the dielectric layer such that said voids reduce the capacitance in the dielectric layer between the conductor and the substrate.

22. The method of claim 1, in which:
   step (c) comprises terminating step (b) when said doped glass dielectric material has been deposited to a thickness in microns which is substantially equal to 5 microns/microns$^2$ times the cross-sectional area of a selected one of said spaces in microns$^2$.

23. The method as in claim 22, further comprising the step, performed between steps (a) and (b), of:
   (d) depositing a low temperature oxide layer over the substrate and said spaces.

24. The method of claim 23, in which step (d) comprises depositing the oxide layer to a thickness of substantially 1,000 to 2,000 Angstroms.

25. The method of claim 1, in which:
   step (a) comprises providing the substrate as further including a plurality of conductors formed thereon such that said spaces are defined between the conductors and said spaces have different sizes; and
   step (c) comprises terminating step (b) when said doped glass dielectric material has been deposited to a thickness which is predetermined in accordance with a size of a selected space defined by one of said conductors which is intended to carry electrical signals at a higher speed than others of said conductors.

26. The method of claim 1, in which:
   step (a) comprises providing the substrate as further including a plurality of conductors formed thereon such that said spaces are defined between the conductors and said spaces have different sizes; and
   step (c) comprises terminating step (b) when said doped glass dielectric material has been deposited to a thickness which is further predetermined such that a reduction of capacitance between the conductors provided by said voids maximizes an overall speed at which electrical signals can propagate through the conductors.

27. A method for the controlled formation of voids in a dielectric layer, comprising the steps of:
   (a) providing a substrate having a plurality of spaces on a surface thereof;
   (b) depositing a doped glass dielectric material over the substrate and said spaces such that voids are formed in said doped glass dielectric material in said spaces; and
   (c) terminating step (b) when said doped glass dielectric material has been deposited to a thickness in microns which is substantially equal to 5 microns/microns$^2$ times the cross-sectional area of a selected one of said spaces in microns$^2$.

28. The method of claim 27, in which step (b) comprises depositing said dope glass dielectric material as including borophosphosilica (BSPG) glass.

29. The method of claim 27, in which step (b) comprises depositing said doped glass dielectric material using chemical vapor deposition.

30. The method of claim 27, in which:
   step (a) comprises providing the substrate as further including a plurality of conductors formed thereon such that said spaces are defined between the conductors.

31. The method of claim 27, further comprising the step of:
   (d) reflowing the dielectric layer.

32. A method for the controlled formation of voids in a dielectric layer, comprising the steps of:
   (a) providing a substrate having a plurality of spaces on a surface thereof;
   (b) depositing a doped glass dielectric material over the substrate and said spaces such that voids are formed in said doped glass dielectric material in upper portions of said spaces; and
   (c) reflowing the dielectric layer;
   in which step (b) comprises selecting a thickness of said doped glass dielectric material such that said voids move to lower portions of said spaces in step (c).

33. A method for the controlled formation of voids in a dielectric layer, comprising the steps of:
   (a) providing a substrate having a plurality of spaces on a surface thereof;
   (b) depositing a doped glass dielectric material over the substrate and said spaces such that voids are formed in said doped glass dielectric material in said spaces; and
   (c) planarizing a surface of the doped glass dielectric material;
   in which step (b) comprises selecting a thickness of said doped glass dielectric material such that said voids will remain in said spaces after performing step (c).

34. A method for the controlled formation of voids in a dielectric layer, comprising the steps of:
   (a) providing a substrate having a plurality of spaces disposed therein; and
   (b) depositing a doped glass dielectric material over the substrate and said plurality of spaces under conditions that are controlled to form a plurality of voids in said doped glass dielectric material;
   each void being spaced in close proximity to a corresponding space and having a height dimension and a width dimension; and
   each space having another height dimension and another width dimension wherein the height and width dimensions of the voids and the spaces are substantially equal.

35. A method according to claim 34, wherein said doped glass dielectric material is borophosphosilica glass.

36. A method according to claim 34, wherein the depositing step includes depositing the doped glass material in a chemical vapor.

37. The method of claim 34, in which:
   step (a) comprises providing the substrate as further including a plurality of conductors formed thereon such that said spaces are defined between said conductors.

38. The method of claim 34, in which step (b) further comprises reflowing the dielectric layer such that said voids remain in said spaces.

39. The method of claim 34, in which:
   step (b) comprises terminating said deposition when said doped glass dielectric material has been deposited to a thickness in microns which is substantially equal to 5 microns/microns$^2$ times the cross-sectional area of a selected one of said spaces in microns$^2$.

40. The method as in claim 39, further comprising the step, performed between steps (a) and (b), of:
   (d) depositing a low temperature oxide layer over the substrate and said spaces.

41. The method of claim 39, in which step (b) further comprises reflowing the dielectric layer such that said voids remain in said spaces.

42. A method for the controlled formation of voids in a dielectric layer, comprising the steps of:
 (a) providing a substrate having a plurality of spaces on a surface thereof;
 (b) depositing a doped glass dielectric material over the substrate and said spaces such that voids are formed in said doped glass dielectric material in said spaces; and
 (c) terminating step (b) to form the dielectric layer when said doped glass dielectric material has been deposited to a thickness which is predetermined in accordance with a size of said spaces such that said voids will remain in the dielectric layer after subsequent processing thereof.

* * * * *